United States Patent [19]

Peterson et al.

[11] Patent Number: 5,552,567
[45] Date of Patent: Sep. 3, 1996

[54] PRINTED CIRCUIT BOARD HAVING A PLURALITY OF CIRCUIT BOARD PATTERNS

[75] Inventors: John P. Peterson, Chapel Hill; Richard A. Szymanowski, Raleigh; Randal T. Fox, Mebane, all of N.C.

[73] Assignee: Northern Telecom Limited, Montreal, Canada

[21] Appl. No.: 398,531

[22] Filed: Mar. 6, 1995

Related U.S. Application Data

[62] Division of Ser. No. 165,473, Dec. 13, 1993, Pat. No. 5,457,390.

[51] Int. Cl.[6] .................................................. H05K 1/00
[52] U.S. Cl. .......................... 174/261; 174/250; 361/777
[58] Field of Search ................................. 174/250, 261, 174/268, 260; 361/748, 751, 760, 777; 439/55

[56] References Cited

U.S. PATENT DOCUMENTS

| | | | |
|---|---|---|---|
| 3,360,749 | 12/1967 | Settig | 333/30 |
| 3,446,972 | 5/1969 | Adler et al. | 250/211 |
| 3,621,482 | 11/1971 | Adler | 333/72 |
| 4,289,384 | 9/1981 | Samek | 350/392 |
| 4,613,924 | 9/1986 | Brault | 361/403 |
| 5,406,454 | 4/1995 | Dinger et al. | 361/752 |

*Primary Examiner*—Laura Thomas
*Attorney, Agent, or Firm*—Foley & Lardner

[57] ABSTRACT

A printed circuit board that has a surface which bears a plurality of circuit board pattern, each pattern being served with at least one individual terminal. The printed circuit board is used for a method of determining the stabilized surface insulation resistance of the substrate of the printed circuit board. The circuit board patterns are spaced-apart so as to lie upon surface band regions extending lengthwise and widthwise of the surface of the printed circuit board, these surface band regions being different from one printed circuit board pattern to another. This arrangement of circuit board patterns results in a substantial surface of the board to be dominated by the patterns suitable for the test procedure.

7 Claims, 2 Drawing Sheets

PRINTED CIRCUIT BOARD HAVING A PLURALITY OF CIRCUIT BOARD PATTERNS

This application is a divisional application of application Ser. No. 08/165,473, filed Dec. 13, 1993, now U.S. Pat. No. 5,457,390.

This invention relates to circuit board manufacture.

During the manufacture of printed circuit boards, circuit components are connected to board circuitry on a surface of the substrate in a soldering process by the step of soldering leads of the components to terminals on the board circuitry. As a part of the soldering process, flux is applied to the surface of the substrate. The soldering process is normally performed by a known technique commonly referred to as "wave soldering" and, after soldering, the completed circuit board is cleaned with a material to remove any excess flux which is likely to cover surface portions of the substrate. Such a cleaning material is chlorinated fluorocarbon, such as freon, and is commonly referred to as CFC.

In more recent times, concerns have been raised regarding the advisability of using CFC, because it is known to be environmentally harmful. As a result, CFC is being avoided by using low solid fluxes, normally referred to as "no clean fluxes", for wave soldering operations. With the use of a no clean flux, a flux deposition on the substrate surface needs to be carefully controlled such that only a required amount necessary for the soldering process is deposited on the substrate. However, there are attendant problems in controlling deposition of a no clean flux. For instance, hot spots may occur in the equipment thus resulting in erratic as distinct from a uniform flux deposition. Also, a preheating operation before entry of a printed circuit board into the solder wave may provide insufficient heat to completely decompose chemical activators in the flux, in addition, active flux may still be present upon a printed circuit board after a wave soldering operation, because of an over application of flux or the activation chemicals may be out of control. As a result, active flux deposits may remain on the substrate surface after manufacture of the PCB and such deposits may have an effect on the performance of the board, e.g. with regard particularly to the insulation properties of the board surface between different conductor paths. Hence, process control procedures are required to test finished boards.

One such procedure involves the determination of surface insulation resistance (referred to herein as "SIR") of printed circuit boards and for this procedure, and after passing through the soldering step finished printed circuit boards are removed at intervals from commercial production for test purposes. The test procedure involves applying for specific periods, a continuous 48 volts operating potential to conductor lines of the circuitry and then, after each period, applying 100 volts test potential at certain positions to different conductor paths, which are laterally spaced, to measure the SIR of the substrate across the lateral gap between these positions. A problem which exists with this procedure is that as a new board is heated by the temperature and humidity induced by the chamber along with the energy applied to the system by the passage of current through it, certain heat induced structural and/or chemical changes take place in the substrate over an initial period and these changes effect changes in the value of the SIR. Eventually the board structure becomes stabilized with the result that the SIR value is also stabilized and becomes an inherent property of the board. Thus over the initial period, changes in SIR produce a curve having a characteristic (referred to herein as an "initial SIR characteristic") up to the end of the period and resulting in substantially stabilized SIR. The characteristic of the curve is a function of the distances between the chosen positions on the substrate at which test potential is applied, the cleanliness of the substrate surface, and the materials and structure of the substrate together with the changes which are occurring to the structure.

Unfortunately, with the printed circuit test coupon removed from commercial production for test purposes, the time taken to establish an initial SIR characteristic and the eventual stabilized SIR is around 96 hrs of continuous test procedure. A problem which is all too apparent with the time lag between when a finished board is removed from a production line and in obtaining the SIR test results is that if the SIR results of the test board do not meet desirable manufacturing criteria, then all of the boards subjected to the soldering operation on the same equipment during this 96 hr period are suspect to not meeting the same criteria. This is highly inconvenient, disruptive to commercial manufacture and is also expensive. Not only therefore is there an extended time period for obtaining stabilized SIR results, but also any modifications to the manufacturing process must be delayed for an inordinate amount of time thereby possibly resulting in large numbers of printed circuit boards proving to be unsatisfactory.

The present invention seeks to provide a method of determining the stabilized SIR of substrates of printed circuit boards which may be used to produce reliable results within a much reduced amount of time, thereby reducing the time lag required to adjust process parameters in a soldering process.

According to the present invention, there is provided a method of determining the stabilized surface insulation resistance of a substrate of a printed circuit board comprising:- providing a test printed circuit board comprising a dielectric substrate having desirable clean conditions on one surface, the surface bearing a predetermined circuit board test pattern with the surface in its desirable clean condition having a known initial surface insulation resistance characteristic resulting in a known stabilized surface insulation resistance; applying flux to the surface of the substrate and subjecting the printed circuit board to a soldering process; and, after the soldering process, determining the initial surface insulation resistance characteristic of the substrate of the test printed circuit board for a specific limited time period consistent with being able to determine from a comparison with the known initial surface insulation resistance characteristic of the desirably clean surface, the stabilized surface insulation resistance characteristic for the substrate of the printed circuit board after subjection to the soldering step.

The test printed circuit board may be treated alone with flux and subjected to a soldering process upon a processing line used in commercial production of printed circuit boards. However, it is preferable to have the test printed circuit board inserted into an actual processing line between other printed circuit boards being made for commercial use. Such commercial boards would bear their own circuit designs which would differ from the test pattern design. Thus, the surface insulation resistance of the test printed circuit board relates to actual manufacturing conditions which apply at that time to commercially made boards.

The above process according to the invention is useful to determine the quality of any known fluxing and soldering process on printed circuit boards. For instance, it may be used to determine the cleanliness condition after the use of cleaning agents to remove residues of flux requiring such cleaning agents. However, the invention has particular use for a soldering operation using a no clean flux in that it provides a measure of flux residues if any remain upon a board after soldering, and flux residue patterns on a board which are indicative of the quantity and of the uniformity of placement of no clean fluxes upon the board. The SIR information may therefore be used to make changes, for instance in flux application, in correct selection of materials or in a preheating operation in the soldering process.

It has been discovered that when the initial SIR characteristic and the stabilized SIR are known for the desirably clean substrate surface bearing the test pattern, then when a specific portion of the initial SIR characteristic has been determined for the test board, the remainder of the curve characteristic may be extrapolated sufficiently accurately to indicate the stabilized SIR of the test board. The extrapolated stabilized SIR of the test board is an indication of the stabilized SIR of each of the commercially manufactured boards immediately upstream and downstream of the test board. It has been discovered that upon the initial SIR characteristic of a test pattern being known, then a relatively short time period is required to determine the stabilized SIR of the substrate of the test printed circuit board bearing the same test pattern. Thus, if the test pattern under desirable cleanliness substrate conditions enables a particular stabilized SIR to be achieved after 96 hrs, when the test printed circuit board bearing the test pattern is passed through a fluxing and soldering operation and tested for a time far below 96 hrs the stabilized SIR of the substrate surface of the test board may be established without significant error. The time taken depends upon the design of the test pattern and upon the test conditions, i.e. upon temperature, humidity and voltage and test conditions. For instance, it is possible to be able to determine whether the test substrate will provide an acceptable SIR within a 24 hr test.

A test pattern may comprise a plurality of parallel spaced conductors which have a predetermined length and spacing.

One convenient test pattern has parallel conductors with alternate conductors extending to one common board terminal and the other conductors extending to another terminal, with the conductor length being about 0.8 inches and a conductor width and separation both being approximately 12.5 mil. This test pattern should provide an average stabilized SIR between conductors at least in the region of $1.25 \times 10^9$ ohms when tested at 85° C. under 85% humidity conditions. Once the initial SIR characteristic for a desirably clean substrate has been determined, a test period of about only 16 hrs should produce sufficient of the initial SIR characteristic of the test printed circuit board to enable its stabilized SIR to be determined.

The method in the invention preferably includes applying the test pattern to the surface of the substrate with a plurality of parallel conductors of desired width and distance apart and with alternate conductors extending to at least one terminal and the other conductors extending to at least one other terminal. The terminals are preferably positioned in spaced locations adjacent at least one edge of the printed circuit board. This is for convenience for test purposes when making electrical connections to test equipment.

While a single test pattern may be applied over the whole substrate surface in order to determine initial SIR characteristics and stabilized SIR values at different positions on the surface, such a procedure could prove to be expensive. As an alternative and practical construction, a plurality of smaller and perhaps identical test patterns are applied to the surface of the substrate with the test patterns spaced apart upon the substrate and lying upon surface band regions extending lengthwise and widthwise of the substrate, the band regions being different from one pattern to another. In this way, surface bands occupying substantially the full width and length of the substrate may be dominated by the test patterns without need for the patterns to occupy the total surface area. In a preferred arrangement, the test patterns extend in series diagonally across the test substrate surface and this may be performed with the test patterns lying along a signal diagonal line or along two or more lines in one or both directions across the substrate surface in diagonal fashion.

It is also preferred in the process to provide rectilinear conductors in each test pattern and in some of the test patterns the conductors extend in a different direction to the conductors in other patterns. This arrangement is to enable the surface resistance test to identify any narrow lines of residual flux or residual flux chemicals extending across the substrate surface.

The invention also includes a printed circuit board comprising a dielectric substrate having one surface bearing a printed circuit bard pattern in which the pattern comprises a plurality of conductors which extend in parallel spaced apart relationship with alternate conductors extending towards at least one terminal and the other conductors extending to at least one other terminal of the board.

One embodiment of the invention will now be described by way of example with reference to the accompanying drawings, in which.

Figure 1:
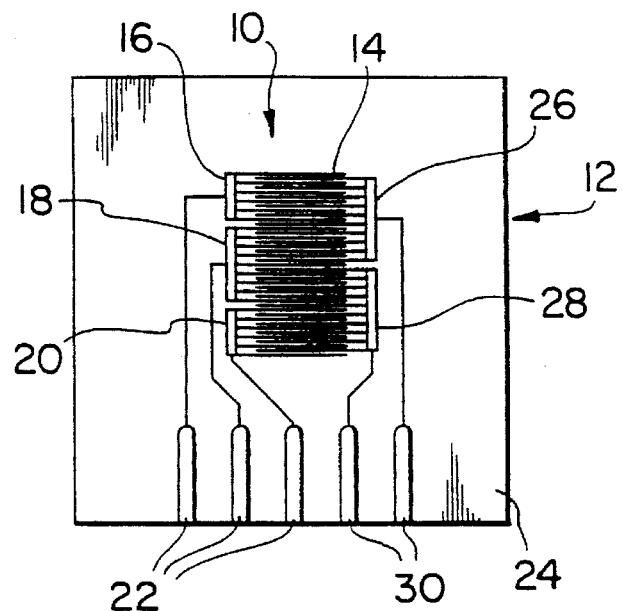
FIG. 1 is a plan view of a test pattern of specific geometry mounted upon a printed circuit board for determining SIR characteristics.

In a method of determining the stabilized SIR of printed circuit boards which have been treated with a no clean flux before a wave soldering operation, a printed circuit board conductor test pattern 10 as shown in FIG. 1 is used. The test pattern 10 is provided upon a substrate 12 to provide a simple printed circuit board, the test pattern 10 being formed by providing a layer of copper on top of the substrate 12 and then, in conventional manner, masking the parts of the copper layer which are required for the circuit and etching away the remainder of the layer to expose the surface of the substrate beneath. As shown by FIG. 1 the test pattern comprises a plurality of parallel electrical conductors 14 which are arranged in a rectangular block with alternate conductors extending to at least one terminal and other conductors extending to at least one other terminal. More specifically, a group of conductors 14 at the upper end of FIG. 1 extend at the left-hand side to a conductor header 16 while two other groups of conductors further below in FIG. 1 terminate in headers 18 and 20 also on the left-hand side. These headers are interconnected with terminal bars 22 extending to one edge 24 of the substrate. The conductors 14 extending from the headers 16, 18 and 20 are interleaved with others of the conductors 14 which extend to headers 26 and 28 on the right-hand side of the test pattern, these headers being interconnected with terminal bars 30 also extending to the edge 24 of the substrate. All conductors have a width of 12.5 mil and a length of 0.8 inches and are spaced apart by distances of 12.5 mil. The important parameter is the number of squares. Squares are defined as the length of the conductor times the spacing between the conductor. The resultant resistance value can then be determined using the squares count value.

Figure 2:
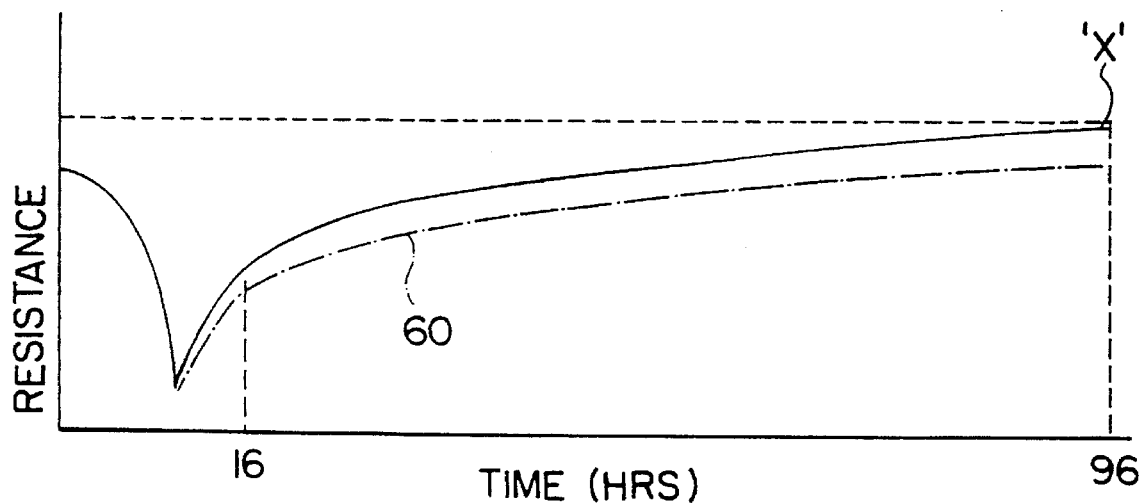
FIG. 2 shows the initial SIR characteristic for a clean substrate surface bearing the test pattern of FIG. 1.

After etching the test pattern onto the substrate 12, the printed circuit board so obtained and in a perfectly clean condition is subjected to a test to determine the stabilized SIR of the substrate between adjacent conductors. This is performed basically in known manner with the use of known surface insulation resistance test equipment, i.e. an Alphametals sirometer. The test is performed by connecting the terminal bars 22 and 30 as in desired manner to the equipment and, under a controlled atmosphere of 85% relative humidity and a fixed temperature of 85° C., a bias potential of 48 volt d.c. is applied to the test circuit. At specific intervals a test voltage of 100 volts d.c. is applied between terminals 22 and 30 to enable SIR measurements to be taken at those times. The test is performed for approximately 96 hrs during which time an SIR curve as an initial SIR characteristic is obtained as shown in FIG. 2. As may be seen, from the left-hand side of FIG. 2, in known manner the SIR drops significantly during the first period of the test, this being caused by the passage of energy into the substrate by temperature, humidity and current heating the substrate material thus resulting in chemical and physical changes to the substrate. After a brief initial period the SIR commences to increase and after a gradual reduction in slope of the curve up to about 96 hrs of test a substantially stabilized SIR is obtained at position "x" indicated in FIG. 2.

The test pattern shown in FIG. 1 is then used to test the fluxing and soldering procedure through a wave soldering operation for commercial production of printed circuit boards. Briefly, this is performed by making a test printed circuit board by disposing a plurality of the test patterns 10 upon a substrate of approximately the size of the printed circuit boards being made commercially and inserting the test board into an in-line soldering process together with the commercially manufactured boards.

Figure 3:
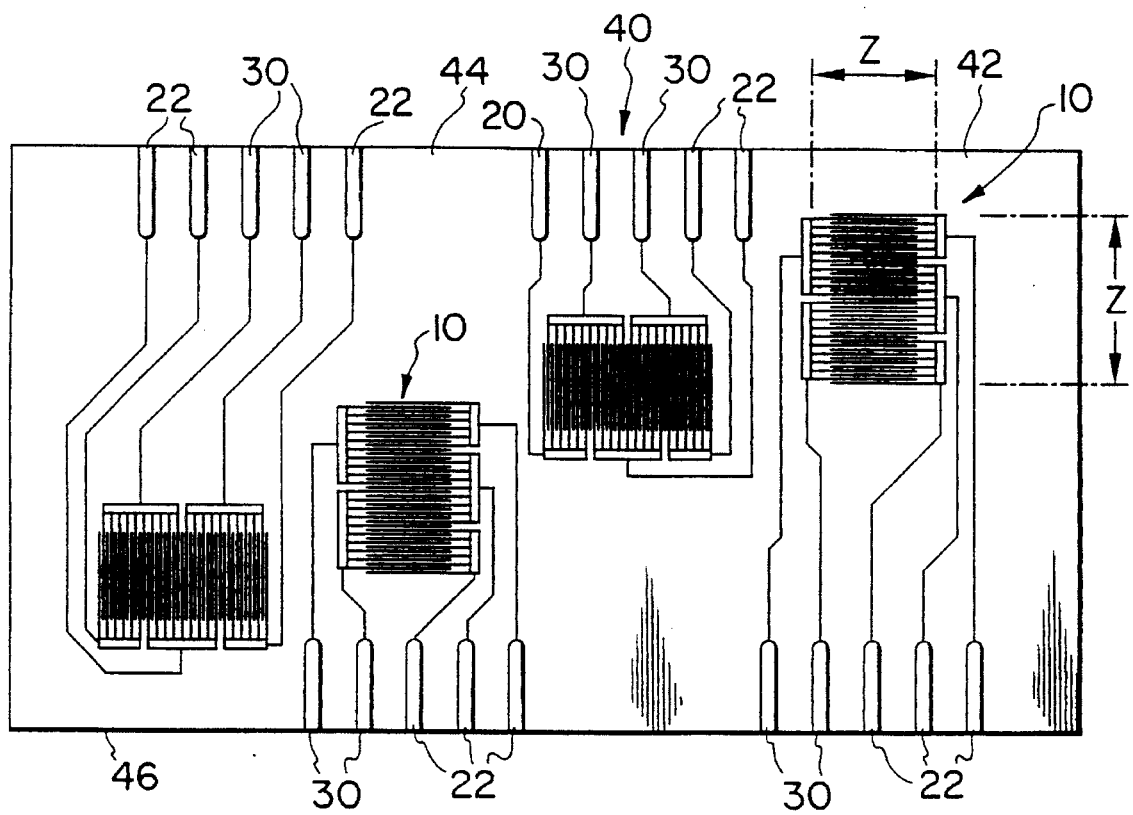
FIG. 3 is a plan view of a printed circuit board carrying a plurality of the test patterns shown in FIG. 1, and to be passed along a wave soldering process line during commercial manufacture of other boards.

As shown in greater detail in FIG. 3 a test printed circuit board 40 has a dielectric substrate 42 of approximately the same plan dimensions as printed circuit boards being made commercially and being passed through a wave soldering operation. There are four test patterns 10 disposed in spaced apart positions upon the substrate 42. The four test patterns are relatively disposed substantially on a diagonal line extending across the substrate 42 so that the test patterns are disposed upon different surface band regions of the substrate extending both lengthwise and widthwise of the substrate surface. The bands for the right-hand test pattern 10 in FIG. 3 are indicated at the right-hand side and above the substrate 42 by reference Z. As may also be seen from FIG. 3 the bands extending lengthwise of the printed circuit board overlap from one test pattern 10 to another. With the test patterns arranged in the above manner, a substantial surface of the board is dominated by the test patterns. With such an arrangement, if there are problems upon the surface of the substrate 42 with regard to deposition uniformity or density of the flux resulting in patches, patterns or lines of residual flux or its resultant breakdown chemicals then surface insulation resistance problems arising therefrom would be identified with such an arrangement. Certainly as may be seen from FIG. 3 while a satisfactory control is made possible by disposing relatively small patterns in strategic positions upon the substrate it is not necessary to cover the whole of the substrate surface with a single test pattern. Hence, the use of small test patterns upon such a surface minimizes the overall cost. In addition, so as to be able to detect more easily lines of residual flux or chemicals in the finished product, the patterns are arranged so that the conductors in some patterns extend in different directions from conductors in the other patterns. In the example shown by FIG. 3, two of the test patterns 10 have their conductors extending horizontally as shown in the figure while the other two test patterns have their conductors 14 extending vertically, the conductors extending in the same direction in different test patterns alternating in the test pattern series across the substrate 2. In addition, each test pattern has its terminal bars 22 or 30 extending to a single edge of the substrate 42, with two of the test patterns 10 having their terminals disposed at edge 44 and the other two test patterns having their terminals disposed at lower edge 46. The test patterns 10 are formed upon the substrate 42 in the same manner as for FIG. 1 and in its desired clean surface condition, the substrate has an initial SIR characteristic and a stabilized SIR comparable to the full outline in FIG. 2.

As described, FIG. 3 relates to a printed circuit board structure with the test patterns 10 mounted on one side only. However, for particular wave soldering procedures, test patterns 10 may be provided on both sides.

Figure 4:
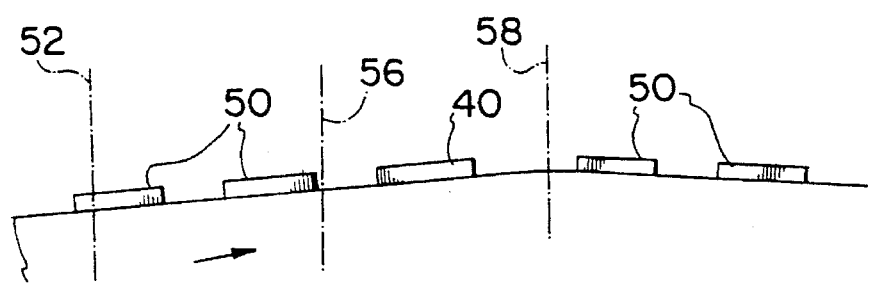
FIG. 4 is a diagrammatic side elevational view of printed circuit boards being passed along the processing line through a wave soldering operation.

Printed circuit boards 50 as shown in FIG. 4 are being made for commercial use and sale and their surface components (not shown) are being attached to terminals on at least one board surface by known wave soldering techniques. In this particular process, each of the bards 50 is passed through a fluxing station 52 in which no clean flux is applied to a surface of each of the boards, the boards then proceeding along a conveyor 54 to a preheating station 56 and then through a wave soldering station 58 before proceeding out of the wave soldering equipment. To ensure a desirable quality and process control, certain information should be obtained concerning the boards 50 and relevant tests need to be made to determine certain properties of the finished boards. One of the requirements is to be able to verify that the boards have a stabilized SIR of the substrate surface which is up to manufacturing requirements. Normally, in conventional procedures it may be required for one of the boards 50 to be removed after the process and tested for a lengthy period of approximately 96 hrs to determine whether the stabilized SIR of that particular board meets expectations. The results of such a test are also used to indicate that boards manufactured subsequently upon the same wave soldering equipment have approximately the same SIR characteristics. A problem with the conventional procedure is the time required for the test and in the case of test results not being satisfactory then each of the boards 50 soldered during the 96 hr period are taken to be substandard.

The present invention, makes it possible however to reduce the test procedure significantly as is shown by this embodiment. In the present embodiment the circuit board 40 is inserted into the process line with the boards 50 as shown in FIG. 4 and is passed through the wave soldering equipment, i.e. through the fluxing station 52, preheating station 54 and wave soldering station 58. Hence, if there are any problems regarding the fluxing or preheating procedures to be found upon the boards 50 then these problems will relate to the bard 40 also.

Subsequently, the board 40 is subjected to a surface insulation resistance test using the same procedure used for testing the test pattern 10 as discussed above with reference to FIGS. 1 and 2. In the test upon the board 40, each of the patterns 10 is tested by disposing the board in a controlled temperature of 85° C. and at a relative humidity of 85% while using a bias potential of 48 volts d.c. with a test potential of 100 volts d.c. at required intervals. As a result of this, for each of the test patterns 10 on the bard 40, the initial SIR characteristic of the substrate surface is progressively developed. These SIR characteristics are somewhat similar to that shown by FIG. 2. However, as the complete initial SIR characteristic produced on a perfectly clean board has already been determined as shown in FIG. 2 for the FIG. 1 printed circuit board, then it is possible to compare the developing initial SIR characteristic of each of the patterns 10 on the board 40 with the example in FIG. 2 as the test proceeds. It has been determined that in a particularly crucial area of each curve, the final stabilized SIR of each of the patterns 10 may be satisfactorily established by a comparison with the characteristic obtained in FIG. 2 for the perfectly clean printed circuit board. This critical period occurs at about 16 hrs after commencement of the SIR test on the board 40. Thus, for any particular test pattern 10 on the board 40, the initial SIR characteristic may for instance follow the chain-dotted outline 60 at FIG. 2, this outline presumably lying beneath the full outline for the test on the FIG. 1 structure. Having, as a guide, the initial SIR characteristic information for the test pattern in FIG. 1, it is possible after obtaining the initial SIR characteristic for a test period of 16 hrs for each test pattern 10 on the board 40 to determine the remainder of the characteristic and the stabilized SIR for the surface of the substrate 42 covered by each test pattern. Thus, the initial SIR characteristic is developed by extrapolation along the chain-dotted line between the 16 and 96 hr positions. The resultant determined stabilized SIR is substantially accurate.

It follows therefore that when the initial SIR characteristic for a test pattern has been predetermined for a perfectly clean board, then it is possible to test the same pattern subsequently upon a board which has been passed through a wave soldering operation and produce only a part of the initial SIR characteristic for that particular test board, the remainder of the curve being arrived at by extrapolation based upon the previous information. As a result, and as indicated above, a test pattern using conductors 0.8 inches long, the conductors being parallel, 12.5 mil wide and spaced apart by 12.5 mil produces initial SIR characteristic results within 24 hrs and advantageously at about 16 hrs which may be used to determine in a confident manner the stabilized SIR of the product. Thus, the time period for determining the stabilized SIR of the board 40 and thus of each of the boards 50 at either side of the board 40 is drastically reduced thereby enabling adjustments to be made to the process more quickly, i.e. to the fluxing and preheating operations than would hitherto have been possible. As may be seen from this, the above process results in less board wastage and also substantially eliminates the possibility of unsatisfactory boards being shipped out to customers.

The process of the invention may be followed using test patterns of different configurations as long as the conductors which are adjacent are parallel and extend to different terminals. The conductors may have different lengths in different patterns and may also have different widths and distances apart. However, for different test patterns, the time required to reach the critical point on the initial SIR characteristic curve during test procedures may be longer or shorter than the 16 hrs discussed in the embodiment and of course different stabilized SIR values may be relevant to the different patterns. For examples of this, while it has been shown that with the test pattern described above the average stabilized SIR for a substrate surface should not be less than $2.5 \times 10^9$ ohms, when using a test pattern with conductors having 12.5 mil width and 12.5 mil apart, the stabilized SIR may be considered unsatisfactory if it is less than $2.5 \times 10^9$ ohms whereas 25 mil width conductors spaced 25 mil apart may produce a satisfactory stabilized SIR of the substrate surface of $5 \times 10^{10}$ ohms.

The width and spacing of the conductors of a printed circuit board test pattern should preferably be as close as possible to reflections of the product being made commercially and for which the SIR values are required. The choice of conductor width and spacing should also be consistent with those normally used in the art and for which acceptable SIR values are publicly available. For example, if in the commercial circuit board product, the conductors are to have a 20 mil pitch, i.e. 12 mil width conductors with 8 mil spacing between conductors, then a test pattern having 6 mil width conductors and 6 mil conductor spacing should be used, because acceptable industry SIR values are available for this conductor width and spacing and may be compared with the test results. This reduces the amount of fresh data needed to establish a minimum SIR value required to ensure product reliability. In addition, the 6 mil spacing in the above test pattern in being narrower than the 8 mil spacing in the above test pattern in being narrower than the 8 mil spacing of the commercial product, is more sensitive to any surface problem areas whereby a stringent control is provided. Further acceptable SIR values are available for other conductor widths and spacings. In another arrangement, if a 50 mil conductor pitch were being used on the commercial product with 20 space between conductors, then 6 mil spacing in a test pattern would be inappropriate due to the cost of producing test patterns and the degree of difficulty in properly soldering the conductors. In this case and for the reasons given above, a 25 mil pitch test pattern should be provided with 12.5 mil between conductors.

What is claimed is:

1. A printed circuit board comprising a dielectric substrate having one surface bearing a plurality of circuit board patterns, the patterns being spaced-apart upon the surface so as to lie upon surface band regions extending lengthwise and widthwise of the surface, the surface band regions being different from one printed circuit board pattern to another, and in which each printed circuit board pattern comprises a plurality of conductors which extend in parallel spaced-apart relationship with alternate conductors extending to at least one individual terminal and the other conductors extending to at least one other individual terminal.

2. A printed circuit board according to claim 1 wherein the terminals are disposed adjacent to at least one edge of the printed circuit board.

3. A printed circuit board according to claim 1 wherein the patterns extend in series diagonally across the substrate surface.

4. A printed circuit board according to claim 1 wherein the conductors in each pattern extend rectilinearly and the conductors in some of the patterns extend in a different direction from conductors in other patterns.

5. A printed circuit board according to claim 4 wherein the patterns extend in series diagonally across the substrate surface and in alternate patterns the conductors all extend in a first direction and in the other test patterns, the conductors extend in a second direction normal to the first direction.

6. A printed circuit board according to claim 1 wherein each circuit board pattern has conductors with a width of approximately 12.5 mil and a length of approximately 0.8 inches and the conductors are spaced apart a distance of approximately 12.5 mil.

7. A printed circuit board comprising a dielectric substrate having one surface bearing a plurality of circuit board patterns, the patterns being spaced-apart upon the surface so as to lie upon surface band regions extending lengthwise and widthwise of the surface, the surface band regions being different from one printed circuit board pattern to another and each circuit board pattern has at least one individual terminal.

\* \* \* \* \*